United States Patent
Shigematsu et al.

(10) Patent No.: US 10,679,897 B2
(45) Date of Patent: Jun. 9, 2020

(54) DEVICE WAFER PROCESSING METHOD

(71) Applicant: DISCO CORPORATION, Tokyo (JP)

(72) Inventors: Koichi Shigematsu, Tokyo (JP); Satoshi Kumazawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/819,012

(22) Filed: Nov. 21, 2017

(65) Prior Publication Data

US 2018/0144983 A1    May 24, 2018

(30) Foreign Application Priority Data

Nov. 22, 2016 (JP) ................................. 2016-226608

(51) Int. Cl.
*H01L 21/78* (2006.01)
*H01L 21/02* (2006.01)
(Continued)

(52) U.S. Cl.
CPC ........ *H01L 21/78* (2013.01); *H01L 21/02076* (2013.01); *H01L 21/3065* (2013.01); *H01L 21/3081* (2013.01); *H01L 21/3083* (2013.01); *H01L 21/6836* (2013.01); *H01L 22/20* (2013.01); *H01L 21/30625* (2013.01); *H01L 21/67069* (2013.01); *H01L 21/67092* (2013.01); *H01L 21/67253* (2013.01);
(Continued)

(58) Field of Classification Search
None
See application file for complete search history.

(56) References Cited

U.S. PATENT DOCUMENTS

| | | | |
|---|---|---|---|
| 2005/0106782 A1* | 5/2005 | Genda | B23K 26/18 438/118 |
| 2008/0226826 A1* | 9/2008 | Tanaka | C23C 18/1689 427/299 |

(Continued)

FOREIGN PATENT DOCUMENTS

| | | |
|---|---|---|
| JP | 2006-120834 | 5/2006 |
| JP | 2012023085 A * | 2/2012 |

OTHER PUBLICATIONS

English Translation of JP 2012023085 A, 2012.*

*Primary Examiner* — Khaja Ahmad
(74) *Attorney, Agent, or Firm* — Greer Burns & Crain, Ltd.

(57) ABSTRACT

Disclosed herein is a device wafer processing method including a protective film forming step of applying a water-soluble protective film material to the front side of a device wafer having devices separated by division lines and next exposing the division lines to form a protective film for protecting each device, an application time recording step of recording the time at which the water-soluble protective film material is applied to the device wafer, a determining step of determining whether or not a predetermined duration has elapsed from the time recorded in the application time recording step, an etching step of dry-etching the device wafer along the division lines after performing the determining step, and a protective film removing step of supplying a cleaning water to the protective film to thereby remove the protective film after performing the etching step. Only when it is determined in the determining step that the predetermined duration has not elapsed, the etching step is performed.

15 Claims, 7 Drawing Sheets

(51) Int. Cl.
*H01L 21/3065* (2006.01)
*H01L 21/66* (2006.01)
*H01L 21/67* (2006.01)
*H01L 21/308* (2006.01)
*H01L 21/683* (2006.01)
*H01L 21/68* (2006.01)
*H01L 23/544* (2006.01)
*H01L 21/306* (2006.01)

(52) U.S. Cl.
CPC .......... *H01L 21/681* (2013.01); *H01L 23/544* (2013.01); *H01L 2221/6834* (2013.01); *H01L 2221/68327* (2013.01); *H01L 2223/54413* (2013.01); *H01L 2223/54433* (2013.01); *H01L 2223/54453* (2013.01)

(56) References Cited

U.S. PATENT DOCUMENTS

2015/0048049 A1* 2/2015 Nishimura ............... C08J 7/123
216/37
2015/0132925 A1* 5/2015 Matsuzaki ............ H01L 21/822
438/465
2016/0276194 A1* 9/2016 Wang ................ H01L 21/67766

* cited by examiner

DEVICE WAFER PROCESSING METHOD

BACKGROUND OF THE INVENTION

Field of the Invention

The present invention relates to a device wafer processing method for processing a device wafer having a plurality of devices formed on the front side.

Description of the Related Art

In performing dry etching to a workpiece such as a device wafer, the devices formed on the front side of the device wafer are covered with a resist film having plasma resistance for protecting the devices (see Japanese Patent Laid-open No. 2006-120834, for example).

SUMMARY OF THE INVENTION

In forming a protective film for protecting the devices in performing the dry etching, a resist film forming apparatus for forming a resist film as the protective film is required. Further, in removing the protective film, an ashing apparatus for ashing the resist film is also required. As a result, the procedure of processing the device wafer becomes complicated as a whole and a processing cost is also increased.

It is therefore an object of the present invention to provide a device wafer processing method including the step of dry-etching a device wafer, which can eliminate an increase in cost and the complication of the processing procedure, thereby efficiently dividing the device wafer into individual chips.

In accordance with an aspect of the present invention, there is provided a device wafer processing method for processing a device wafer having a front side formed with a plurality of crossing division lines for defining a plurality of separate regions where a plurality of devices are formed, the device wafer processing method including a protective film forming step of applying a water-soluble protective film material to the front side of the device wafer and next exposing the division lines to form a protective film for protecting each device; an application time recording step of recording the time at which the water-soluble protective film material is applied to the device wafer; a determining step of determining whether or not a predetermined duration has elapsed from the time recorded in the application time recording step; an etching step of dry-etching the device wafer along the division lines after performing the protective film forming step, the application time recording step, and the determining step; and a protective film removing step of supplying a cleaning water to the protective film to thereby remove the protective film after performing the etching step; in which when it is determined in the determining step that the predetermined duration has not elapsed from the time recorded in the application time recording step, the etching step and the protective film removing step are performed.

Preferably, the device wafer processing method further includes a cleaning step of supplying a cleaning water to the protective film to thereby remove the protective film after performing the determining step and before performing the etching step, in which when it is determined in the determining step that the predetermined duration has elapsed from the time recorded in the application time recording step, the protective film is once removed in the cleaning step and thereafter the protective film forming step, the application time recording step, and the determining step are performed again in this order.

As described above, the device wafer processing method according to the present invention includes the protective film removing step of supplying a cleaning water to the water-soluble protective film formed on the front side of the device wafer to thereby remove the protective film, after performing the etching step. Accordingly, the water-soluble protective film can be easily removed from the front side of the device wafer by simply supplying the cleaning water. That is, it is unnecessary to provide various equipment including a resist film forming apparatus and an ashing apparatus, so that a processing cost can be suppressed and the device wafer can be efficiently divided into individual chips.

There is a case that when a predetermined duration has elapsed after applying the water-soluble protective film material to the front side of the device wafer to form the protective film, the water-soluble protective film material may be deteriorated in dry-etching the device wafer. When the water-soluble protective film material is deteriorated by the dry etching, there is a possibility that the protective film may not be dissolved in the cleaning water supplied to remove the protective film before or after dividing the device wafer, so that the protective film cannot be removed. If the protective film cannot be removed, the device wafer may be damaged in processing to cause a large problem. To cope with this problem, the device wafer processing method according to the present invention includes the determining step of determining whether or not the predetermined duration has elapsed from the time recorded in the application time recording step, before performing the etching step, in which only when it is determined in the determining step that the predetermined duration has not elapsed from the time recorded in the application time recording step, the etching step and the protective film removing step are performed. Accordingly, there is no possibility that the protective film cannot be removed by the cleaning water, thereby preventing possible damage to the device wafer in processing it.

Further, when it is determined in the determining step that the predetermined duration has elapsed from the time recorded in the application time recording step, the cleaning step is performed to once remove the protective film before performing the etching step. Thereafter, the protective film forming step, the application time recording step, and the determining step are performed again in this order. Accordingly, a new protective film can be formed on the device wafer, and the etching step can be performed to this device wafer. As a result, wasting of the device wafer can be eliminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
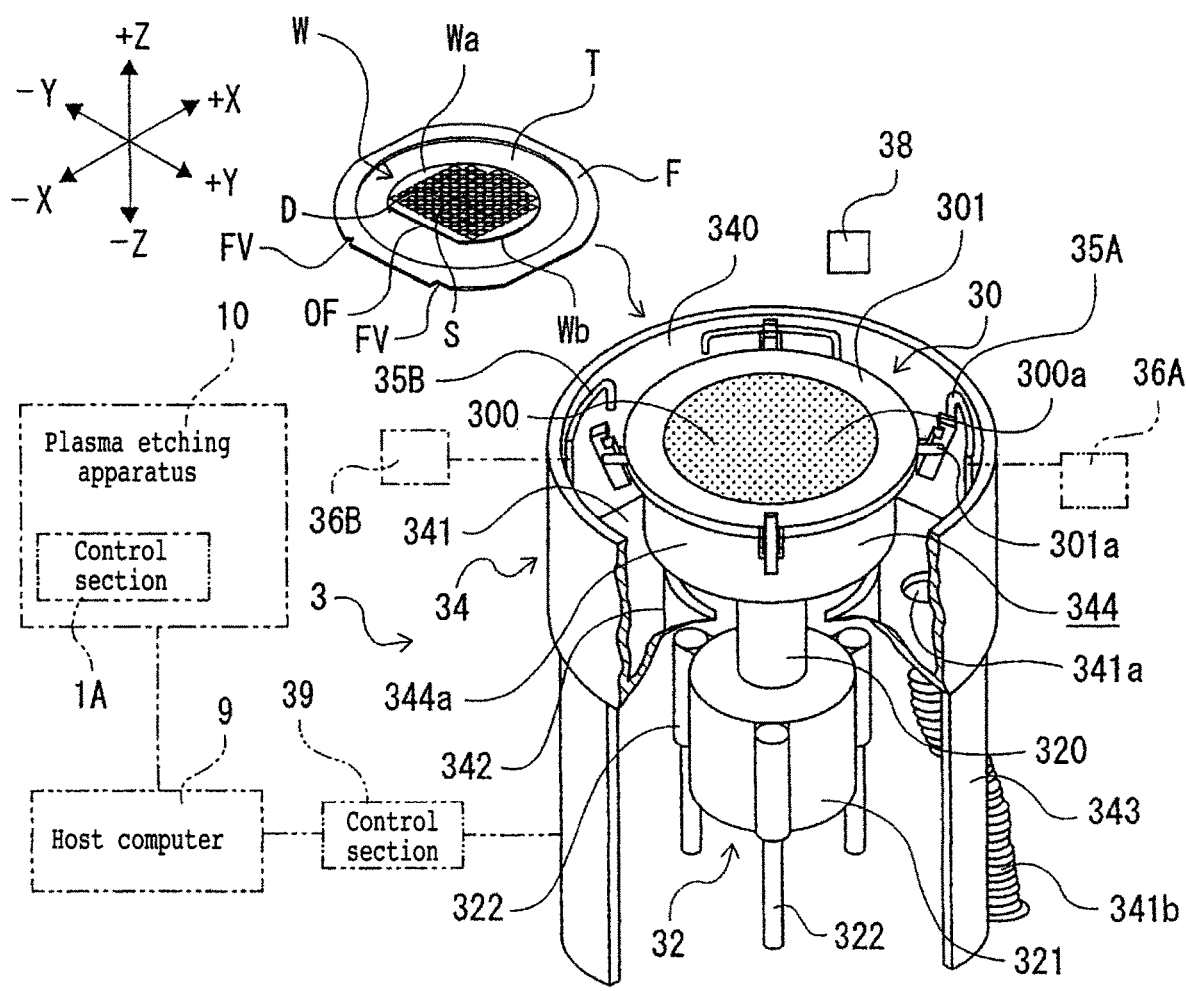
FIG. 1 is a perspective view showing a protective film forming apparatus and a device wafer supported to an annular frame.

A preferred embodiment of the device wafer processing method according to the present invention will now be described with reference to the attached drawings. In this preferred embodiment, a device wafer W shown in FIG. 1 is divided into individual device chips by the device wafer processing method. The device wafer W (which will be hereinafter referred to simply as "wafer W") shown in FIG. 1 is a disk-shaped semiconductor wafer such as a silicon substrate. The wafer W has a front side Wa and a back side Wb. The front side Wa of the wafer W is formed with a plurality of crossing division lines S to thereby define a plurality of separate regions where a plurality of devices D are individually formed. The wafer W has a peripheral area where the devices D are not formed, and a part of this peripheral area is flat cut off to form an orientation flat OF indicating a crystal orientation. On the front side Wa of the wafer W in the peripheral area where the orientation flat OF is formed, a mark (e.g., bar code or integrated circuit (IC) tag) (not shown) indicating individual identifying information of the wafer W is formed. The individual identifying information includes a lot number, kind of the devices D, kind of the substrate, outer diameter of the wafer W, and pitch of the division lines S.

The back side Wb of the wafer W is attached to a circular protective tape T larger in diameter than the wafer W. More specifically, the protective tape T has an adhesive surface, and the back side Wb of the wafer W is attached to the adhesive surface of the protective tape T in its central portion. A peripheral portion of the adhesive surface of the protective tape T is attached to an annular frame F. The protective tape T is preferably formed of a material having resistance to plasma etching. Alternatively, the protective tape T may have a thickness such that it is not cut by plasma etching. The outer diameter of the annular frame F is formed with two notches FV recessed radially inward toward the center of the annular frame F. A part of the outer circumference of the annular frame F between the two notches FV is a flat portion, and this flat portion of the annular frame F is opposed to the orientation flat OF of the wafer W. Further, the front side Wa of the wafer W is exposed upward. In this condition, the wafer W is supported through the protective tape T to the annular frame F, so that handling of the wafer W is allowed through the annular frame F. The shape of the wafer W is not especially limited, and the kind of the wafer W is not limited to a semiconductor wafer. Further, the wafer W may not be supported to the annular frame F. Further, the mark (e.g., bar code) indicating the individual identifying information of the wafer W may be formed on the annular frame F in the peripheral area between the two notches FV rather than on the wafer W. In the case that the mark indicating the individual identifying information of the wafer W is formed on the annular frame F, the individual identifying information of the wafer W can be easily grasped even after applying a water-soluble protective film material to the wafer W to cover the front side Wa of the wafer W.

Referring to FIG. 1, there is shown a protective film forming apparatus 3. The protective film forming apparatus 3 includes a holding table 30 for holding the wafer W, rotating means 32 for rotating the holding table 30, and a cylindrical casing 34 having a bottom. The upper end of the cylindrical casing 34 is formed as a circular opening. The protective film forming apparatus 3 functions to apply a water-soluble protective film material to the front side Wa of the wafer W, thereby forming a water-soluble protective film on the front side Wa of the wafer W. The protective film forming apparatus 3 also functions to supply a cleaning water to the water-soluble protective film, thereby removing the water-soluble protective film from the front side Wa of the wafer W.

The holding table 30 has a circular outside shape. The holding table 30 includes a suction holding member 300 for holding the wafer W under suction and a frame member 301 for supporting the suction holding member 300. The suction holding member 300 is formed of a porous material. The suction holding member 300 is connected to a vacuum source (not shown). Accordingly, a suction force produced by the vacuum source is applied to the suction holding member 300. The suction holding member 300 has an upper exposed surface functioning as a holding surface 300a. The holding surface 300a of the suction holding member 300 is flush with the upper surface of the frame member 301. The suction force produced by the vacuum source is transmitted to the holding surface 300a, so that the wafer W placed on the holding surface 300a is held under suction. Thus, the wafer W can be held on the holding table 30 under suction. Further, a plurality of (e.g., four) clamps 301a for fixing the annular frame F is provided on the outer circumference of the frame member 301 so as to be arranged at equal intervals.

The rotating means 32 is located below the holding table 30. The rotating means 32 includes a spindle 320 fixed at its upper end of the lower surface of the holding table 30 and a rotational drive source 321 such as a motor connected to the lower end of the spindle 320. The spindle 320 is rotatable about its axis extending in a vertical direction. Accordingly, when the spindle 320 is rotated by operating the rotational drive source 321, the holding table 30 fixed to the spindle 320 is also rotated. The rotational drive source 321 is vertically movably supported by a support mechanism 322 composed of a plurality of air cylinders, for example. When the rotational drive source 321 is raised by operating the support mechanism 322, the holding table 30 is raised to a standby position where the wafer W is loaded or unloaded, whereas when the rotational drive source 321 is lowered by operating the support mechanism 322, the holding table 30 is lowered to a working position where the wafer W is processed in the casing 34.

The holding table 30 is stored in the inside space of the casing 34. In FIG. 1, a part of the casing 34 is cut away, so as to show the internal structure of the casing 34. The casing 34 is composed of an outer wall 340 surrounding the holding table 30, a bottom plate 341 integrally connected to the lower end of the outer wall 340 and having a central opening for insertion of the spindle 320, and an inner wall 342 projecting upward from the inner circumference of the central opening of the bottom plate 341. The casing 34 is supported by a plurality of legs 343 fixed at their upper ends to the bottom plate 341. The bottom plate 341 is formed with a drain hole 341a extending through the thickness of the bottom plate 341. A hose 341b is connected to the drain hole 341a, so as to drain the water-soluble protective film material from the casing 34. That is, the water-soluble protective film material flows down from the holding surface 300a of the holding table 30 to a receiving space defined by the outer wall 340, the bottom plate 341, and the inner wall 342. The water-soluble protective film material received in the receiving space is drained from the drain hole 341a through the hose 341b.

Figure 2:
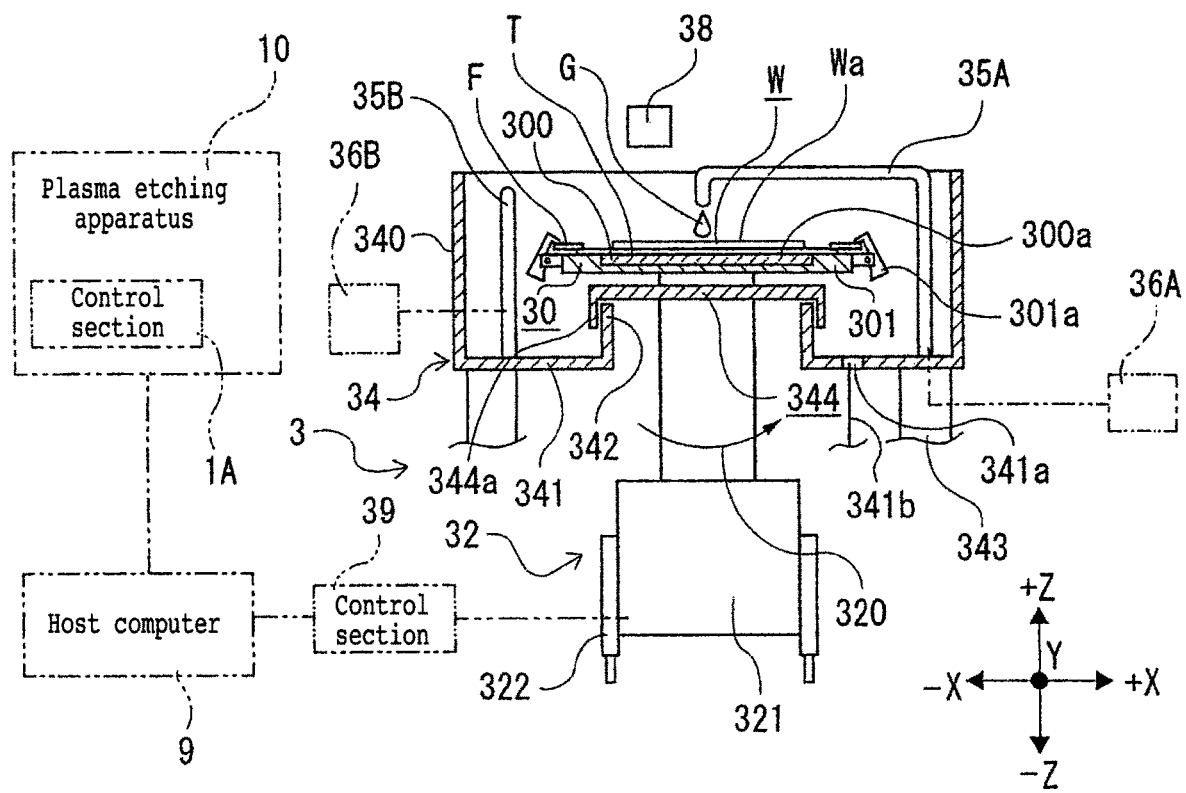
FIG. 2 is a sectional view for illustrating a coating step of applying a water-soluble protective film material to the front side of the device wafer.

As shown in FIG. 2, a circular cover member 344 is fixed to the spindle 320 in such a manner that the spindle 320 is inserted through the cover member 344 at its central portion. The cover member 344 is located between the lower surface of the holding table 30 and the upper end of the inner wall 342. The cover member 344 has a skirt portion 344a projecting downward from the outer circumference of the cover member 344 in the −Z direction. In the working position shown in FIG. 2, the cover member 344 is lowered together with the holding table 30 so that the skirt portion 344a of the cover member 344 surrounds the inner wall 342. That is, the skirt portion 344a functions to prevent that the water-soluble protective film material flowing down from the holding surface 300a of the holding table 30 may enter the annular space between the spindle 320 and the inner wall 342.

There are provided in the casing 34 a protective film material nozzle 35A and a cleaning water nozzle 35B. The protective film material nozzle 35A functions to discharge a water-soluble protective film material G in the form of a liquid toward the front side Wa of the wafer W held on the holding surface 300a under suction. The cleaning water nozzle 35B functions to discharge a cleaning water toward the front side Wa of the wafer W held on the holding surface 300a under suction. Each of the nozzles 35A and 35B has an inverted L-shaped configuration as viewed in side elevation in such a manner as to include a vertical portion extending upward from the bottom plate 341 of the casing 34 and a horizontal portion horizontally extending from the upper end of the vertical portion. A nozzle opening is formed at the front end of the horizontal portion so as to open toward the holding surface 300a of the holding table 30. Each of the nozzles 35A and 35B is rotatable about the axis of the corresponding vertical portion extending in the Z direction in such a manner that the corresponding nozzle opening is movable between an operating position above the holding table 30 and a retracted position radially outside the holding table 30. The protective film material nozzle 35A is connected to protective film material supplying means 36A shown in FIG. 2 for supplying the water-soluble protective film material G to the front side Wa of the wafer W. Further, the cleaning water nozzle 35B is connected to cleaning water supplying means 36B shown in FIG. 2 for supplying the cleaning water to the front side Wa of the wafer W.

The water-soluble protective film material G to be supplied from the protective film material supplying means 36A to the wafer W is a water-soluble liquid resin such as PVP (polyvinyl pyrrolidone) and PVA (polyvinyl alcohol). The water-soluble protective film material G preferably contains fine particles of metal oxide (e.g., titanium oxide or zinc oxide) in a dispersed condition.

The protective film forming apparatus 3 includes a control section 39 composed mainly of a central processing unit (CPU) and a storage device such as a memory. The control section 39 controls various conditions including the amount of the water-soluble protective film material G to be supplied, or the duration of discharge of the material G from the nozzle 35A, and the rotational speed of the holding table 30.

A mark reading section 38 for reading the mark indicating the individual identifying information of the wafer W is provided above the casing 34. As described above, the mark indicating the individual identifying information of the wafer W is previously formed on the wafer W or on the annular frame F. In the case that this mark is a bar code, the mark reading section 38 is a bar code reader. In the case that this mark is an IC tag, the mark reading section 38 is an IC tag reader. The mark reading section 38 functions to read the individual identifying information of the wafer W held on the holding table 30 through the mark and then transmit the information read to the control section 39. As a modification, the mark reading section 38 may not be included in the protective film forming apparatus 3.

(1-1) Coating Step as a First Substep of Applying a Water-Soluble Protective Film Material to the Front Side of the Wafer in the Protective Film Forming Step First, a coating step is performed to apply the water-soluble protective film material G to the front side Wa of the wafer W by using the protective film forming apparatus 3. In the coating step, the wafer W supported through the protective tape T to the annular frame F is placed on the holding surface 300a of the holding table 30 set at the standby position shown in FIG. 1 in the condition where the protective tape T is oriented downward, i.e., the front side Wa of the wafer W is oriented upward. At this time, the center of the wafer W is set so as to substantially coincide with the center of the holding table 30. Thereafter, a suction force produced by the vacuum source (not shown) is transmitted to the holding surface 300a of the holding table 30, thereby holding the wafer W on the holding surface 300a under suction in the condition where the front side Wa of the wafer W is exposed upward. Further, the clamps 301a are operated to fix the annular frame F.

The orientation flat OF of the wafer W held on the holding table 30 is detected, and the mark reading section 38 is positioned above the front side Wa of the wafer W in the area where the orientation flat OF is formed. At this position, the mark reading section 38 reads the mark indicating the individual identifying information of the wafer W. In the case that this mark is formed on the annular frame F, the mark reading section 38 is positioned above the annular frame F and this mark is then read by the mark reading section 38. Thereafter, the mark reading section 38 transmits the individual identifying information read above to the control section 39, and this information is then stored in the memory of the control section 39. In the case that the mark reading section 38 is not included in the protective film forming apparatus 3 or in the case that the mark indicating the individual identifying information of the wafer W is not formed on the wafer W or on the annular frame F, an operator may write this mark on the annular frame F so that this mark can be grasped.

Thereafter, the support mechanism 322 is operated under the control by the control section 39 to lower the holding table 30 holding the wafer W to the working position set in the casing 34 as shown in FIG. 2. At this working position of the holding table 30, the protective film material nozzle 35A is rotated to move the nozzle opening of the nozzle 35A to the position just above the center of the front side Wa of the wafer W held on the holding table 30. Thereafter, the protective film supplying means 36A is operated to supply the water-soluble protective film material G to the nozzle 35A and drop a predetermined amount of the film material G from the nozzle opening of the nozzle 35A to the center of the front side Wa of the wafer W. Further, the rotational drive source 321 is operated to rotate the spindle 320 in the counterclockwise direction as viewed from the +Z side, for example, thereby rotating the holding table 30.

Accordingly, the water-soluble protective film material G dropped onto the front side Wa of the wafer W is spread from the center of the front side Wa of the wafer W toward the outer circumference thereof by a centrifugal force produced by the rotation of the holding table 30. Thus, the film material G is spread to fully cover the front side Wa of the wafer W. In this manner, the water-soluble protective film material G is applied to the whole surface of the front side Wa of the wafer W. The remaining film material G not applied to the front side Wa of the wafer W is allowed to flow down from the holding table 30 to the bottom plate 341 of the casing 34, and then drained from the drain hole 341a to the outside of the casing 34. While the water-soluble protective film material G is applied to the whole surface of the front side Wa of the wafer W in this preferred embodiment, it is not always required to apply the film material G to the whole surface of the front side Wa of the wafer W, but it is essential that the film material G is to be applied to fully cover the device area where the devices D are formed on the front side Wa of the wafer W.

Figure 3:
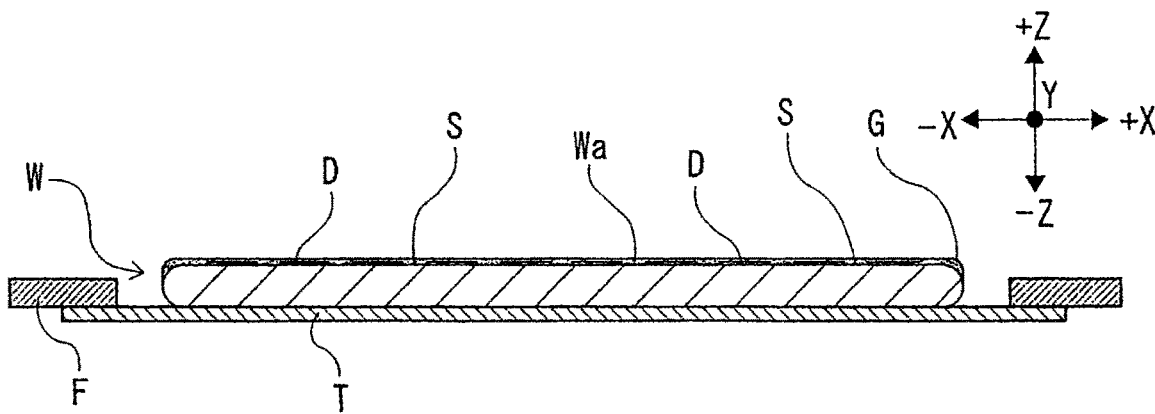
FIG. 3 is a sectional view showing a condition where the water-soluble protective film material is applied to the front side of the device wafer by performing the coating step shown in FIG. 2.

Thereafter, the rotation of the holding table 30 is continued and the application of the water-soluble protective film material G is continued to form a thin film until the thickness of the thin film reaches a predetermined thickness as shown in FIG. 3. Thereafter, the thin film is dried by the rotation of the holding table 30. As required, the thin film of the water-soluble protective film material G applied to the front side Wa of the wafer W is cured by baking, for example. In the case that metal oxide is contained in the water-soluble protective film material G, the thin film of the film material G is improved in plasma resistance. Accordingly, even when the thickness of this thin film formed on the front side Wa of the wafer W is small, dry etching of the wafer W in an etching step to be performed later can be well performed.

(2) Application Time Recording Step

As shown in FIG. 1, a host computer 9 is connected to the control section 39 of the protective film forming apparatus 3. This host computer 9 is also connected to a control section 1A of a plasma etching apparatus 10 shown in FIGS. 1 and 6. The host computer 9 is composed mainly of a CPU for performing computation according to a control program, a read only memory (ROM) previously storing the control program, and a random access memory (RAM) for storing the result of computation, other information, etc. For example, the time t1 at which the thin film of the water-soluble protective film material G is formed on the whole surface of the front side Wa of the wafer W so as to have a predetermined thickness (as the time t1 at which the water-soluble protective film material G is applied to the wafer W) is recorded as processing information into the memory of the control section 39. Then, the information on the time t1 is associated with the individual identifying information of the wafer W previously transmitted from the mark reading section 38 to the control section 39 and stored into the memory (e.g., this individual identifying information will be hereinafter referred to as the individual identifying information of the wafer W assigned to No. 1). The control section 39 transmits the information on the time t1 and the individual identifying information of the wafer W assigned to No. 1 associated with each other to the host computer 9. The information on the time t1 and the individual identifying information of the wafer W assigned to No. 1 transmitted to the host computer 9 are stored into the RAM of the host computer 9.

In this preferred embodiment, the time at which the thin film of the water-soluble protective film material G is formed on the whole surface of the front side Wa of the wafer W so as to have a predetermined thickness is used as the time t1 at which the water-soluble protective film material G is applied to the wafer W, and this time is recorded by the control section 39. However, the time t1 at which the water-soluble protective film material G is applied to the wafer W is not limited to the above time.

For example, the time at which the rotary drying of the thin film of the water-soluble protective film material G is finished after the thickness of the thin film has reached a predetermined thickness may be used as the time t1 at which the water-soluble protective film material G is applied to the wafer W, and this time may be recorded by the control section 39.

As another modification, the time at which the water-soluble protective film material G starts to be dropped from the protective film material nozzle 35A onto the wafer W may be used as the time t1 at which the water-soluble protective film material G is applied to the wafer W, and this time may be recorded by the control section 39.

As a further modification, the operator rather than the control section 39 may record the time t1 at which the water-soluble protective film material G is applied to the wafer W, by writing the time t1 on the annular frame F.

Figure 4:
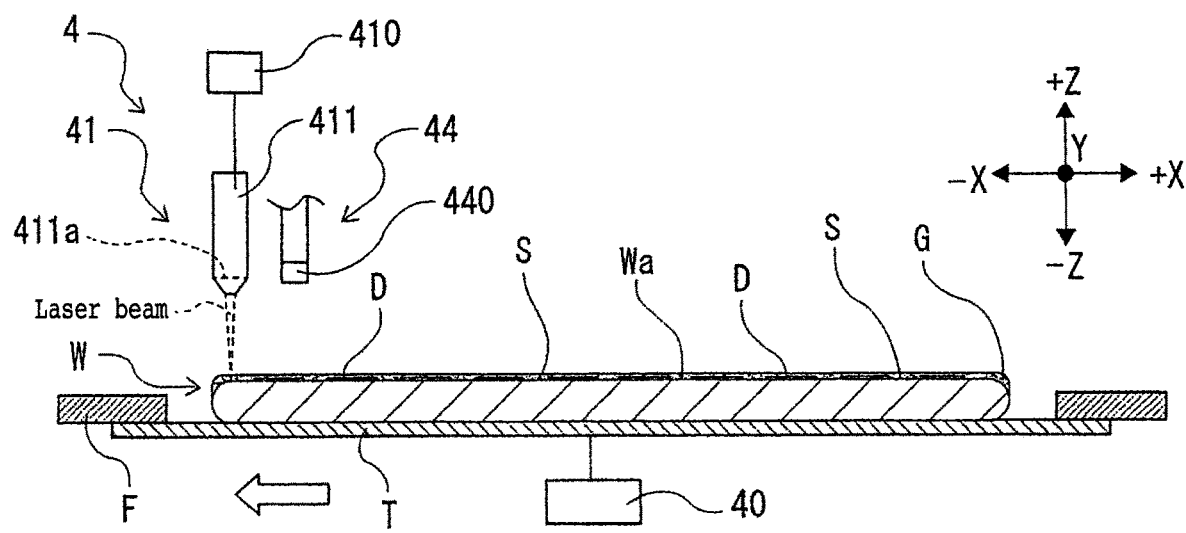
FIG. 4 is a sectional view for illustrating a line exposing step of applying a laser beam to the device wafer after performing the coating step, thereby exposing division lines formed on the front side of the device wafer.

(1-2) Line Exposing Step as a Second Substep of Exposing the Division Lines Formed on the Front Side of the Wafer in the Protective Film Forming Step After recording the time t1 as mentioned above, the wafer W with the thin film of the water-soluble protective film material G formed on the whole surface of the front side Wa is transferred from the protective film forming apparatus 3 to a laser processing apparatus 4 shown in FIG. 4. The laser processing apparatus 4 includes a chuck table 40 for holding the wafer W under suction and laser beam applying means 41 for applying a laser beam to the wafer W held on the chuck table 40. In FIG. 4, the chuck table 40 is schematically shown. Although not shown, the chuck table 40 has a holding surface formed of a porous material for holding the wafer W under suction. The chuck table 40 is rotatable about its axis extending in a vertical direction (Z direction) and also movable in the X direction (+X direction and −X direction).

The laser beam applying means 41 includes a laser oscillator 410 for oscillating a laser beam, focusing means 411 having a focusing lens 411a for focusing the laser beam, and an optical transmitting system such as an optical fiber for transmitting the laser beam from the laser oscillator 410 to the focusing means 411, whereby the laser beam oscillated from the laser oscillator 410 can be transmitted through the optical transmitting system to the focusing means 411 and then precisely focused on each division line S of the wafer W held on the chuck table 40.

Alignment means 44 for detecting the division lines S of the wafer W held on the chuck table 40 is provided in the vicinity of the laser beam applying means 41. The alignment means 44 includes imaging means 440 for imaging the front side Wa of the wafer W. Accordingly, any one of the division lines S of the wafer W to which the laser beam is to be applied can be detected according to an image obtained by the imaging means 440. The alignment means 44 and the laser beam applying means 41 are integrated in configuration, and both are movable together in the Y direction and in the Z direction.

The line exposing step is performed by using the laser processing apparatus 4, so as to expose the division lines S of the wafer W, the front side Wa of which is fully covered with the thin film of the water-soluble protective film material G. In the line exposing step, the wafer W is first held on the chuck table 40 under suction in the condition where the thin film of the water-soluble protective film material G formed on the front side Wa of the wafer W is exposed upward. Thereafter, the wafer W held on the chuck table 40 is fed in the −X direction (forward direction), and the division lines S are detected by the imaging means 440. According to the image of the division lines S detected by the imaging means 440, the alignment means 44 performs image processing such as pattern matching to thereby detect the position of each division line S. In association with the detection of the position of each division line S, the laser beam applying means 41 is moved in the Y direction to align the focusing means 411 with a target one of the division lines S to which the laser beam is to be applied.

Thereafter, a laser beam having an absorption wavelength to the thin film of the water-soluble protective film material G is applied from the laser beam applying means 41 to the wafer W, and at the same time the chuck table 40 is moved in the −X direction at a predetermined feed speed. Accordingly, the laser beam is applied to the wafer W along the target division line S in the −X direction to thereby evaporate the thin film of the water-soluble protective film material G along the target division line S, thus partially removing the thin film along the target division line S to expose the target division line S. In the case that fine particles of metal oxide are contained in the water-soluble protective film material G in a dispersed condition, the fine particles function to improve the absorptivity of the laser beam by the thin film of the water-soluble protective film material G. Accordingly, in this case, the thin film of the water-soluble protective film material G can be easily removed along the target division line S by the laser beam.

Figure 5:
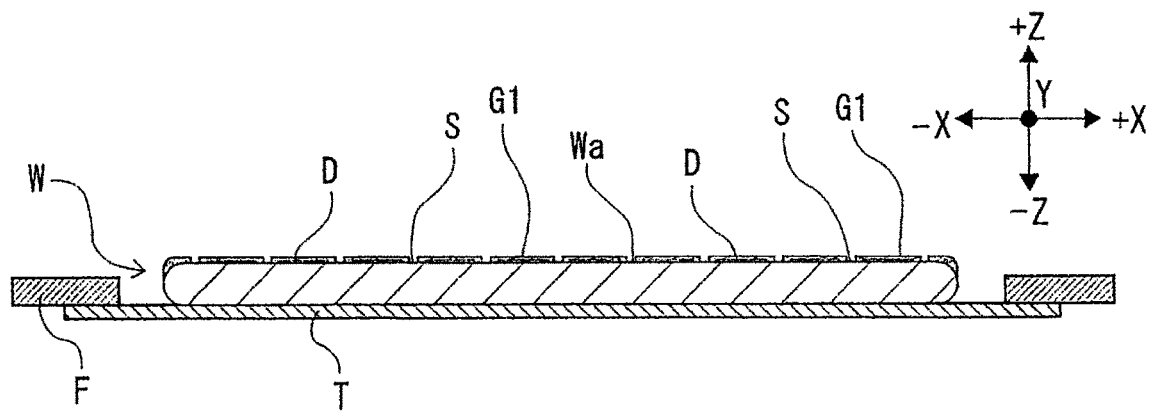
FIG. 5 is a sectional view showing a condition where the division lines are exposed to form a protective film by performing the line exposing step shown in FIG. 4.

For example, the laser beam may be applied under the following processing conditions.
(Processing Conditions)
Light source: YAG pulsed laser or YVO4 pulsed laser
Wavelength: 355 nm
Average power: 0.5 W
Repetition frequency: 200 kHz
Spot diameter of the laser beam: 10 μm
Feed speed of the chuck table 40: 100 mm/second When the wafer W comes to a predetermined position in the X direction where the application of the laser beam along the target division line S is ended, the application of the laser beam is once stopped and the feeding of the wafer W in the −X direction (forward direction) is also once stopped. Thereafter, the laser beam applying means 41 is moved in the Y direction so that the focusing means 411 is aligned with the next division line S adjacent to the above target division line S in the Y direction. Thereafter, the chuck table 40 is fed in the +X direction (backward direction) and the laser beam is applied again along this next division line S to thereby similarly remove the thin film of the water-soluble protective film material G along this next division line S. Thereafter, such laser processing is similarly performed along the remaining division lines S extending in a first direction. After performing the laser processing along all the division lines S extending in the first direction, the chuck table 40 is rotated 90 degrees to similarly perform the laser processing along all the other division lines S extending in a second direction perpendicular to the first direction. As a result, the thin film of the water-soluble protective film material G is partially removed along all of the crossing division lines S of the wafer W to thereby expose all of the crossing division lines S as shown in FIG. 5. Accordingly, the thin film of the water-soluble protective film material G is left as a protective film G1 so as to cover each device D formed on the front side Wa of the wafer W as shown in FIG. 5. Thereafter, the wafer W thus having the protective film G1 formed on each device D is transferred to a plasma etching apparatus 10 shown in FIG. 6.

Figure 6:
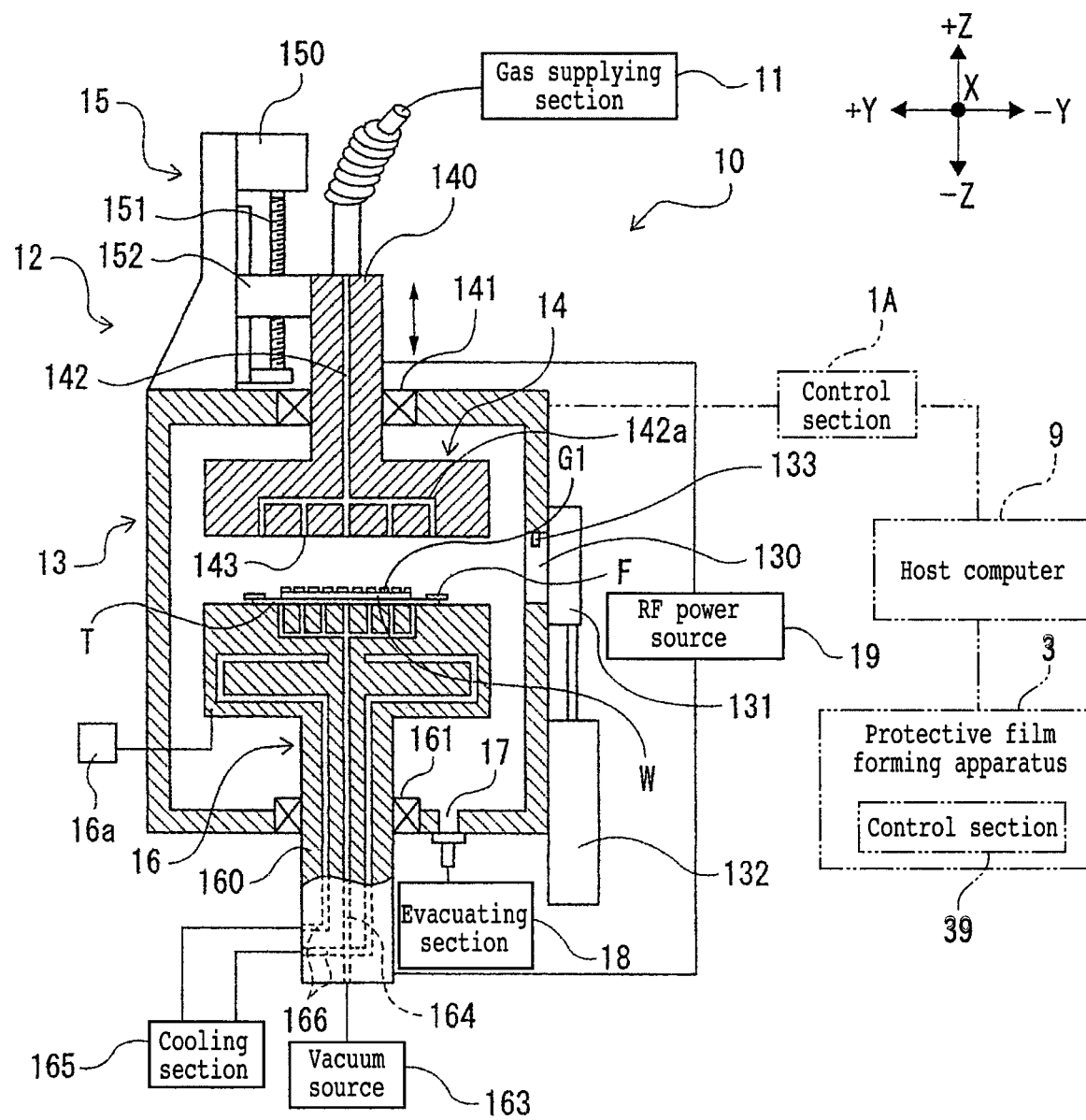
FIG. 6 is a sectional view showing a plasma etching apparatus for performing an etching step to the device wafer.

The plasma etching apparatus 10 shown in FIG. 6 includes a gas supplying section 11 and an etching section 12. The gas supplying section 11 previously stores a fluorine-based etching gas such as $SF_6$, $CF_4$, $C_2F_6$, and $C_2F_4$ and a plasma assist gas, e.g., a rare gas such as Ar and He, which functions to assist the dissociation of the etching gas into a plasma.

The etching section 12 is so configured as to receive the wafer W from the outside and the etching gas from the gas supplying section 11 and to dissociate the etching gas into a plasma, which functions to etch the wafer W. More specifically, the etching section 12 includes a chamber 13 in which the plasma etching is performed. Etching gas discharging means 14 is provided in the chamber 13 at an upper portion thereof, and a chuck table 16 for holding the wafer W to be etched is provided in the chamber 13 at a lower portion thereof.

The etching gas discharging means 14 functions to discharge the etching gas toward the exposed surface of the wafer W held on the chuck table 16. The etching gas discharging means 14 includes a shaft portion 140 inserted through an upper wall portion of the chamber 13 so as to be vertically movably supported by a bearing 141. A gas supply passage 142 is formed in the shaft portion 140 so that the upper end of the gas supply passage 142 is connected to the gas supplying section 11. The lower end of the gas supply passage 142 is connected to a gas diffusion space 142a, which is branched to communicate with a plurality of discharge openings 143. These plural discharge openings 143 open to the lower surface of the etching gas discharging means 14 so as to direct the etching gas toward the wafer W held on the chuck table 16.

The etching gas discharging means 14 is adapted to be vertically moved by elevating means 15. The elevating means 15 includes a motor 150, a ball screw 151 connected to the motor 150, and a movable member 152 having a nut threadedly engaged with the ball screw 151, in which the movable member 152 is connected to the shaft portion 140. Accordingly, when the motor 150 is operated to rotate the ball screw 151, the movable member 152 is vertically moved to thereby vertically move the etching gas discharging means 14.

The chuck table 16 includes a shaft portion 160 inserted through a lower wall portion of the chamber 13 so as to be rotatably supported by a bearing 161. A suction passage 164 is formed in the shaft portion 160 so that the lower end of the suction passage 164 is connected to a vacuum source 163 such as a compressor and a vacuum generating apparatus. A cooling passage 166 communicating with a cooling section 165 is also formed in the shaft portion 160. The upper end of the suction passage 164 is branched to communicate with a plurality of suction openings exposed to the upper surface (holding surface) of the chuck table 16. Accordingly, a suction force produced by the vacuum source 163 is transmitted through the suction passage 164 to the holding surface of the chuck table 16, thereby holding the wafer W on the chuck table 16 under suction. The cooling section 165 functions to supply a cooling water through the cooling passage 166 to the inside of the chuck table 16, thereby cooling the holding surface of the chuck table 16 during the plasma etching. Accordingly, the temperature of the holding surface of the chuck table 16 during the plasma etching can be maintained at a predetermined temperature or less where no gas is generated from the protective tape T attached to the wafer W. The vacuum source 163 is not essential. That is, in the case that the vacuum source 163 is not used, the chuck table 16 may be provided by an electrostatic chuck incorporating an electrode such as a metal plate, in which a direct current voltage is applied to this electrode to thereby generate an electrostatic attracting force due to polarization between the holding surface of the chuck table 16 and the wafer W, so that the wafer W can be held on the chuck table 16 by this electrostatic attracting force.

A load/unload opening 130 for loading and unloading the wafer W is formed at a side portion of the chamber 13. The load/unload opening 130 is adapted to be opened and closed by a shutter 131. The shutter 131 is vertically movable by shutter moving means 132 such as an air cylinder.

The load/unload opening 130 is provided with a mark reading section 133 for reading the mark indicating the individual identifying information of the wafer W, in which this mark is previously formed on the wafer W or on the annular frame F. In the case that this mark is a bar code, the mark reading section 133 is a bar code reader, whereas in the case that this mark is an IC tag, the mark reading section 133 is an IC tag reader. The mark reading section 133 functions to read the individual identifying information of the wafer W passing through the load/unload opening 130, through the mark formed on the wafer W or on the annular frame F, and then transmit this information read to the control section 1A composed mainly of a CPU and a storage device such as a memory. The mark reading section 133 may be located at any position other than the load/unload opening 130. Further, the plasma etching apparatus 10 may not be provided with the mark reading section 133.

A gas outlet opening 17 is formed at the lower wall portion of the chamber 13. The gas outlet opening 17 is connected to an evacuating section 18. By operating the evacuating section 18, the inside space of the chamber 13 can be evacuated to a predetermined degree of vacuum and the gas used in the chamber 13 can also be removed through the gas outlet opening 17. A radio frequency (RF) power source 19 is connected to the etching gas discharging means 14 and the chuck table 16, so as to apply an RF voltage between the etching gas discharging means 14 and the chuck table 16, thereby dissociating the etching gas into a plasma. The frequency and power of the RF voltage may be selected so that the etching gas can be dissociated into a plasma suitable for etching and a sufficient number of etching species can be obtained. Further, bias RF voltage supplying means 16a is connected to the chuck table 16.

In the plasma etching apparatus 10, the control section 1A functions to control the discharge amount or discharge duration of the etching gas from the etching gas discharging means 14 and the RF voltage to be applied, for example. As shown in FIG. 6, the host computer 9 is connected to the control section 1A.

(3) Determining Step

After forming the protective film G1 on the wafer W as shown in FIG. 5 and then transferring the wafer W to the plasma etching apparatus 10, a determining step is performed to determine whether or not a predetermined duration Ta has elapsed from the time t1 recorded in the application time recording step. When this predetermined duration Ta has elapsed, the protective film G1 starts to be deteriorated by the dry etching. For example, the protective film G1 starts to be too dried, causing undue hardening. This predetermined duration Ta is arbitrarily set according to the kind of the water-soluble protective film material G and the thickness of the protective film G1, for example. Information on this predetermined duration Ta is previously stored in the host computer 9.

The determining step is specifically performed in the following manner. The shutter 131 is lowered to open the load/unload opening 130 of the chamber 13 in the plasma etching apparatus 10. In this condition, the wafer W is loaded from the load/unload opening 130 into the chamber 13. Since the mark reading section 133 for reading the mark indicating the individual identifying information of the wafer W is provided at the load/unload opening 130, this mark is read by the mark reading section 133 at the time when the wafer W passes through the load/unload opening 130. Thereafter, the mark reading section 133 transmits this information read, i.e., the individual identifying information of the wafer W assigned to No. 1 to the control section 1A. At this time, the control section 1A also records a time t2 at which the wafer W passes through the load/unload opening 130. Information on the time t2 and the individual identifying information of the wafer W assigned to No. 1 are both transmitted from the control section 1A to the host computer 9. The above time t2 is not limited to the time at which the wafer W passes through the load/unload opening 130.

Thereafter, the host computer 9 reads the information on the time t1 associated with the individual identifying information of the wafer W assigned to No. 1 previously stored in the RAM, according to a control program. Thereafter, the host computer 9 calculates an actual duration Tb from the time t1 to the time t2.

Thereafter, the host computer 9 compares the actual duration Tb calculated above with the predetermined duration Ta and then determines whether or not the actual duration Tb is greater than the predetermined duration Ta, that is, whether or not the predetermined duration Ta has elapsed from the time t1. Thereafter, the host computer 9 transmits the result of this determination to the control section 1A. As a modification, the result of this determination may be informed by a loudspeaker or the like or displayed on a monitor so that the operator can recognize.

In this determining step, the operator may determine whether or not the predetermined duration Ta has elapsed from the time t1. In this case, the operator records the time t1 previously written on the annular frame F supporting the wafer W and also records the time t2 at which the wafer W has been transferred to the plasma etching apparatus 10. Then, the operator determines whether or not the predetermined duration Ta has elapsed from the time t1 by comparing the time t1 and the time t2.

(4) Etching Step

When it is determined in the determining step that the predetermined duration Ta has not elapsed from the time t1 recorded in the application time recording step, an etching step of dry-etching the wafer W along the division lines S is performed under the control by the control section 1A.

In the etching step, the wafer W supported through the protective tape T to the annular frame F is placed on the chuck table 16 in the condition where the protective tape T attached to the back side Wb of the wafer W is in contact with the holding surface of the chuck table 16. Thereafter, the vacuum source 163 is operated to hold the wafer W through the protective tape T on the holding surface of the chuck table 16 under suction. Thereafter, the load/unload opening 130 is closed and the evacuating section 18 is operated to evacuate the chamber 13 to a vacuum condition.

Thereafter, the etching gas discharging means 14 is lowered and the gas supplying section 11 is operated to supply an etching gas composed mainly of $SF_6$, for example, to the gas supply passage 142 and to discharge the etching gas from the lower surface (the discharge openings 143) of the etching gas discharging means 14. At this time, the RF power source 19 is operated to apply an RF voltage between the etching gas discharging means 14 and the chuck table 16, thereby dissociating the etching gas into a plasma. Further, the bias RF voltage supplying means 16a is operated to apply a bias RF voltage to the wafer W, thereby attracting the etching gas in the plasma state toward the wafer W.

The plasma etching may be performed under the following etching conditions.

|  | Duration | RF power for plasma production | Bias power | Etching gas |
|---|---|---|---|---|
| #1 | 1 sec | 3 kW | 250 W | $SF_6$ |
| #2 | 6 sec | 3 kW | 50 W | $SF_6$ |
| #3 | 2 sec | 2.5 kW | 50 W | $C_4F_8$ |

The above steps #1, #2, and #3 constitute one cycle of plasma etching, and tens of cycles are repeated. The frequency of the RF power for plasma production and the frequency of the bias RF power are both set to 13.56 MHz.

Figure 7:
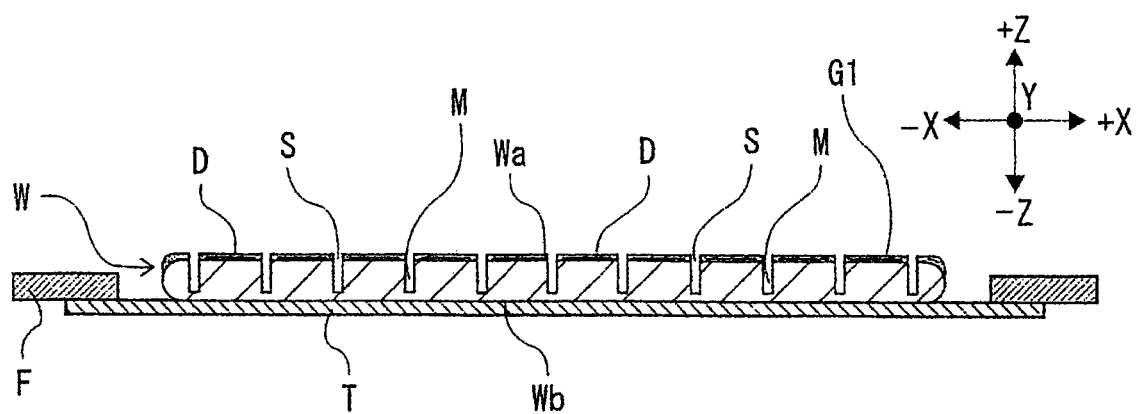
FIG. 7 is a sectional view showing a condition where the device wafer is etched along the division lines to form etched grooves by performing the etching step shown in FIG. 6.

The protective film G1 for protecting each device D is not etched by the etching gas in the plasma state, but only the area corresponding to the division lines S exposed to the front side Wa of the wafer W is etched in the −Z direction (anisotropic etching). As a result, a plurality of crossing etched grooves M are formed on the front side Wa of the wafer W along the division lines S as shown in FIG. 7. In the case that the protective film G1 for protecting each device D contains metal oxide, the plasma resistance of the protective film G1 can be improved to thereby further suppress the etching effect to the protective film G1. Accordingly, it is possible to prevent that the protective film G1 may be etched to cause exposure of the devices D during the plasma etching.

Figure 8:
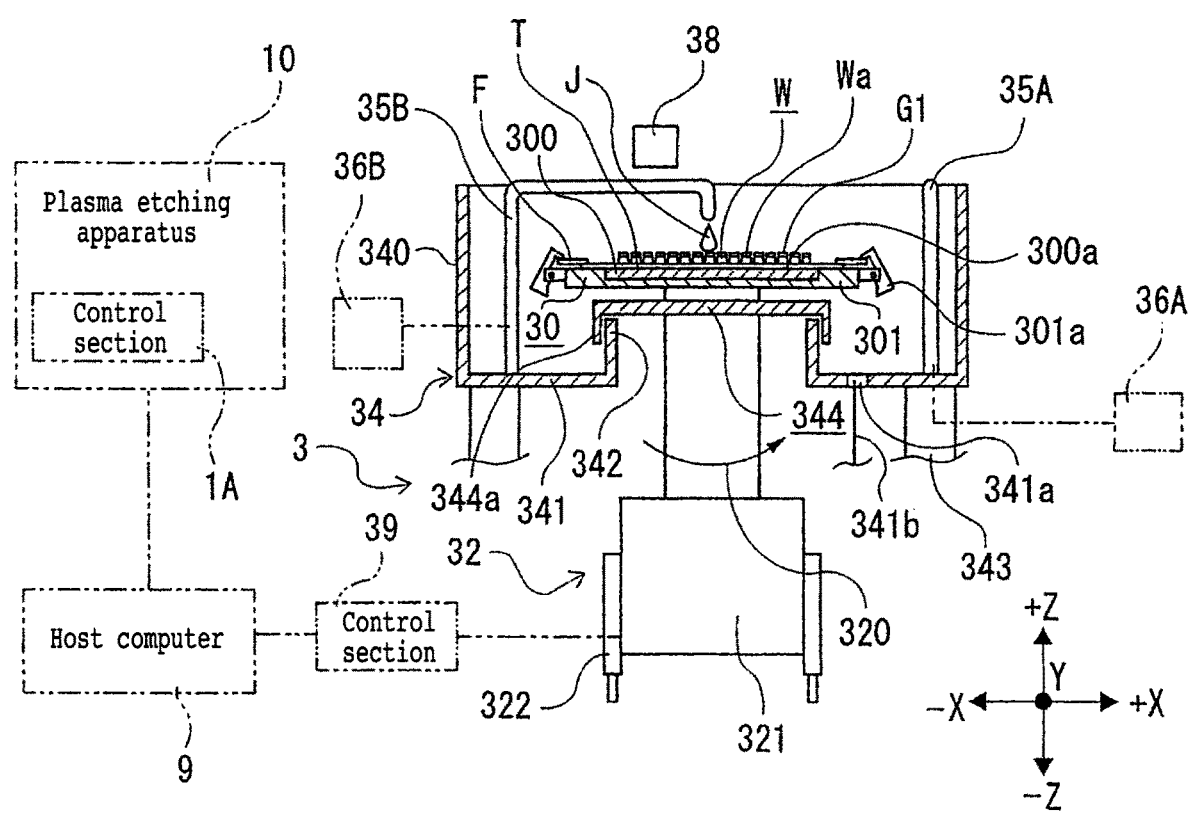
FIG. 8 is a sectional view for illustrating a protective film removing step of supplying a cleaning water to the protective film to thereby remove the protective film from the device wafer.

When a predetermined period of time has elapsed from the start of the plasma etching, the depth of each etched groove M becomes a predetermined depth not reaching the back side Wb of the wafer W as shown in FIG. 7. At this time, the plasma etching is finished. Thereafter, the load/unload opening 130 is opened to unload the wafer W having the etched grooves M from the chamber 13. Thereafter, the wafer W is transferred to the protective film forming apparatus 3, so as to remove the protective film G1 as shown in FIG. 8. In the above plasma etching, the wafer W may be etched from the front side Wa to the back side Wb (full cutting).

(5) Protective Film Removing Step

After performing the etching step, a protective film removing step is performed to supply a cleaning water to the protective film G1, thereby removing the protective film G1 from the front side Wa of the wafer W. In the protective film removing step, the wafer W is first held on the holding table 30 under suction in the condition where the front side Wa (protective film G1) is exposed upward as shown in FIG. 8. Further, the annular frame F is fixed by the clamps 301a. Thereafter, the holding table 30 holding the wafer W is lowered to the working position in the casing 34 as shown in FIG. 8. Thereafter, the cleaning water nozzle 35B is rotated so that the nozzle opening of the nozzle 35B is moved to the position just above the center of the front side Wa of the wafer W held on the holding table 30. Thereafter, the cleaning water supplying means 36B is operated to supply a cleaning water J (e.g., pure water) to the cleaning water nozzle 35B. Accordingly, the cleaning water J is discharged from the nozzle opening of the nozzle 35B toward the center of the front side Wa of the wafer W. At this time, the rotational drive source 321 is operated to rotate the spindle 320 in the counterclockwise direction as viewed in the +Z side, thereby rotating the holding table 30.

Accordingly, the water-soluble protective film G1 is dissolved by the cleaning water J and allowed to flow with the cleaning water J from the center of the front side Wa of the wafer W toward the outer circumference thereof owing to a centrifugal force generated by the rotation of the holding table 30. Thereafter, the cleaning water J containing the protective film G1 is allowed to drop from the holding table 30 to the bottom plate 341 of the casing 34. In this manner, the protective film G1 is removed from the upper surface of each device D formed on the front side Wa of the wafer W, so that each device D is exposed on the front side Wa of the wafer W. Thereafter, the wafer W is transferred to a grinding apparatus 2 shown in FIG. 9.

(6) Grinding Step

Figure 9:
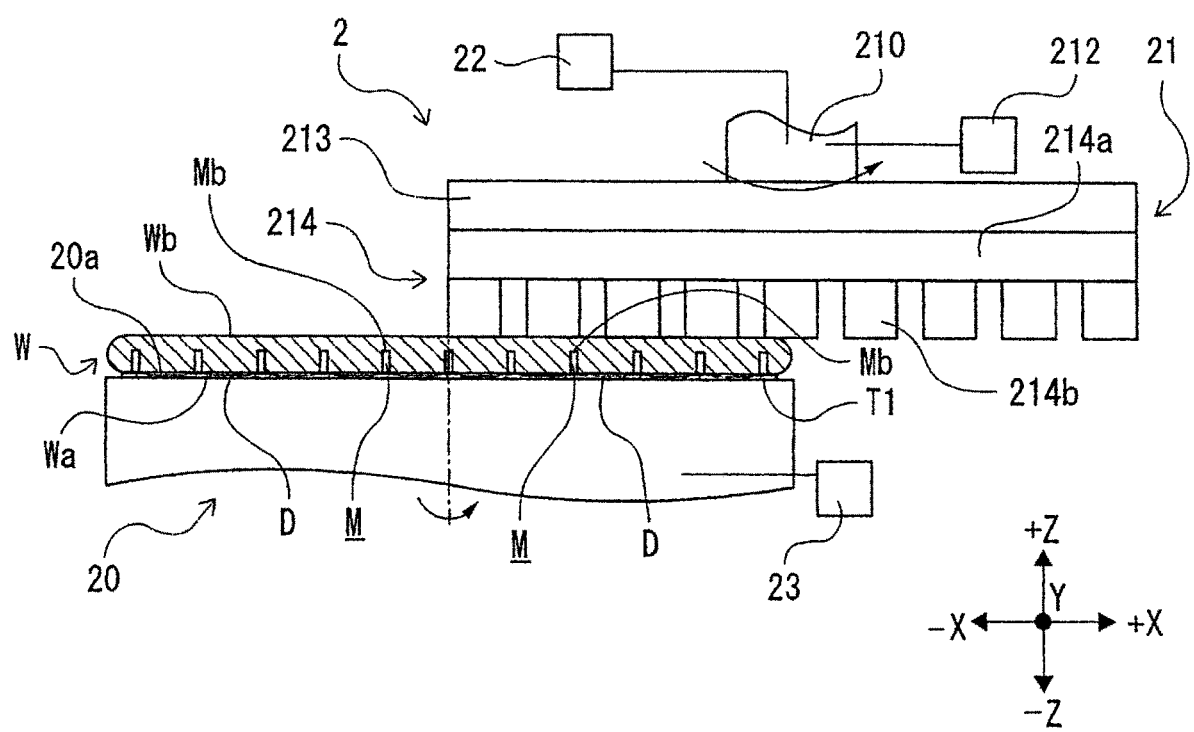
FIG. 9 is a sectional view for illustrating a grinding step of grinding the back side of the device wafer to reduce the thickness of the device wafer to a finished thickness and also to expose the bottom of each etched groove to the back side of the device wafer, thereby dividing the device wafer into individual chips.

After performing the protective film removing step, a grinding step is performed by using the grinding apparatus 2 shown in FIG. 9 to grind the back side Wb of the wafer W. The grinding apparatus 2 includes a holding table 20 for holding the wafer W under suction and grinding means 21 for grinding the wafer W held on the holding table 20. The holding table 20 is circular in outside shape and has a holding surface 20a formed of a porous material for holding the wafer W under suction. The holding table 20 is rotatable about its axis extending in a vertical direction (Z direction) and also movable in the X direction (+X direction and −X direction) by X moving means 23.

The grinding means 21 is vertically movable in the Z direction (Z direction and −Z direction) by feeding means 22. That is, by operating the feeding means 22, the grinding means 21 is moved toward or away from the holding surface 20a of the holding table 20. The grinding means 21 includes a spindle 210 rotatable about its axis extending in a vertical direction (Z direction), a motor 212 for rotating the spindle 210, a circular mount 213 connected to the lower end of the spindle 210, and an annular grinding wheel 214 detachably mounted on the lower surface of the mount 213.

The grinding wheel 214 is composed of an annular wheel base 214a and a plurality of abrasive members 214b fixed to the lower surface of the wheel base 214a so as to be arranged annularly along the outer circumference of the wheel base 214a, in which each abrasive member 214b has a substantially rectangular prismatic shape. Each abrasive member 214b is formed by bonding diamond abrasive grains with a resin bond or a metal bond, for example. While the plural abrasive members 214b are used in this preferred embodiment, an annular single abrasive member may be used.

A grinding water passage (not shown) is formed in the spindle 210 so as to extend in the axial direction (Z direction) of the spindle 210. The grinding water passage is connected at an upper end thereof to a grinding water source (not shown). The grinding water passage extends through the mount 213 and the lower end of the grinding water passage opens to the lower surface of the wheel base 214a so as to discharge a grinding water toward the abrasive members 214b.

After removing the protective film G1 from the wafer W, the back side Wb of the wafer W is ground by the grinding apparatus 2 to a finished thickness. At the same time, the back side Wb of the wafer W is ground until the bottom of each etched groove M is exposed to the back side Wb, thereby dividing the wafer W into individual chips individually having the devices D. Prior to performing the grinding step, the front side Wa of the wafer W is attached to a protective member Ti having the same diameter as that of the wafer W, so as to protect the devices D as shown in FIG. 9. Further, the protective tape T is peeled from the back side Wb of the wafer W, so that the support by the annular frame F is canceled.

In performing the grinding step, the wafer W is placed on the holding surface 20a of the holding table 20 in the condition where the back side Wb of the wafer W is oriented upward. At this time, the center of the wafer W is set so as to substantially coincide with the center of the holding table 20. Thereafter, a vacuum source (not shown) connected to the holding surface 20a is operated to produce a suction force, which is transmitted to the holding surface 20a, thereby holding the wafer W on the holding surface 20a under suction.

Thereafter, the holding table 20 holding the wafer W is moved in the +X direction to the position below the grinding means 21. Further, the wafer W is preset in position relative to the grinding wheel 214 of the grinding means 21 in the X direction. Thereafter, the motor 212 is operated to rotate the spindle 210 in the counterclockwise direction as viewed from the +Z side, thereby rotating the grinding wheel 214 in the same direction. Further, the feeding means 22 is operated to feed the grinding means 21 in the −Z direction so that the abrasive members 214b of the grinding wheel 214 being rotated abut against the back side Wb of the wafer W, thereby grinding the back side Wb of the wafer W. During the grinding operation, the holding table 20 is also rotated in the counterclockwise direction as viewed from the +Z side, so that the whole surface of the back side Wb of the wafer W is ground by the abrasive members 214b.

In this grinding step, the grinding wheel 214 is fed at a predetermined feed speed by a predetermined amount to grind the back side Wb of the wafer W until the bottom Mb of each etched groove M is exposed to the back side Wb of the wafer W. As a result, when the bottom Mb of each etched groove M is exposed to the back side Wb of the wafer W, the wafer W is divided into individual chips individually having the devices D.

As described above, the device wafer processing method according to the present invention includes the protective film forming step of applying the water-soluble protective film material G to the front side Wa of the wafer W and next exposing the division lines S to form the protective film G1 for protecting each device D, the application time recording step of recording the time t1 at which the water-soluble protective film material G is applied to the wafer W, the etching step of dry-etching the wafer W along the division lines S after performing the protective film forming step and the application time recording step, and the protective film removing step of supplying the cleaning water J to the protective film G1 to thereby remove the protective film G1 after performing the etching step. Accordingly, the protective film G1 can be easily removed from the front side Wa of the wafer W by simply supplying the cleaning water J. That is, it is unnecessary to provide various equipment including a resist film forming apparatus and an ashing apparatus, so that a processing cost can be suppressed and the wafer W can be efficiently divided into individual chips.

Furthermore, the device wafer processing method according to the present invention further includes the determining step of determining whether or not the predetermined duration Ta has elapsed from the time t1 recorded in the application time recording step, before performing the etching step, in which only when it is determined in the determining step that the predetermined duration Ta has not elapsed from the time t1 recorded in the application time recording step, the etching step and the protective film removing step are performed. Accordingly, there is no possibility that the protective film G1 cannot be removed by the cleaning water J, thereby preventing possible damage to the wafer W.

(7) Cleaning Step

In the case that the host computer 9 determines in (3) the determining step that the predetermined duration Ta has elapsed from the time t1 recorded in (2) the application time recording step, (4) the etching step is not performed, but a cleaning step is performed to supply the cleaning water J to the wafer W, thereby removing the protective film G1.

More specifically, when the host computer 9 shown in FIG. 6 transmits the result of determination that the predetermined duration Ta has elapsed, to the control section 1A, the loading of the wafer W into the chamber 13 of the plasma etching apparatus 10 is stopped under the control by the control section 1A. Thereafter, the wafer W is transferred to the protective film forming apparatus 3 shown in FIG. 8, so as to remove the protective film G1. Thereafter, as in (5) the protective film removing step mentioned above, the protective film G1 is removed from the front side Wa of the wafer W by supplying the cleaning water J. As a result, the protective film G1 formed on each device D of the wafer W is removed, so that each device D is exposed and the original condition of the wafer W shown in FIG. 1 is restored. Thereafter, (1-1) the protective film forming step (the coating step and the line exposing step), the application time recording step, and (3) the determining step are performed again in this order.

Thus, the device wafer processing method according to the present invention further includes the cleaning step to be performed before performing the etching step, in which when it is determined in the determining step that the predetermined duration Ta has elapsed from the time t1 recorded in the application time recording step, the protective film G1 is once removed in the cleaning step and thereafter the protective film forming step, the application time recording step, and the determining step are performed again in this order. Accordingly, a new protective film G1 not deteriorated can be formed on each device D of the wafer W, and the etching step can be performed to this wafer W. As a result, wasting of the wafer W can be eliminated.

The device wafer processing method according to the present invention is not limited to the above preferred embodiment. Further, the protective film forming apparatus 3, the laser processing apparatus 4, the plasma etching apparatus 10, and the grinding apparatus 2 are merely illustrative and they may be suitably changed in configuration or the like within the scope where the effects of the present invention can be exhibited.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A device wafer processing method for processing a device wafer having a front side formed with a plurality of crossing division lines for defining a plurality of separate regions where a plurality of devices are formed, said device wafer processing method comprising:
    a protective film forming step of applying a water-soluble protective film material to the front side of said device wafer and next exposing said division lines to form a protective film for protecting each device, wherein the protective film is selected from the group consisting of polyvinyl pyrrolidone and polyvinyl alcohol;
    an application time recording step of recording the time at which said water-soluble protective film material is applied to said device wafer, wherein said application time recording step is performed after a predetermined thickness of the protective film has been applied on an entire surface of the front side of said device wafer during said protective film forming step;
    a determining step of determining whether or not a predetermined duration has elapsed from the time recorded in said application time recording step, wherein said determining step is performed when said device wafer passes by a mark reading section that reads a mark indicative of individual identifying information of said device wafer, and further wherein said determining step is performed before said device wafer enters an etching chamber;
    an etching step of dry-etching said device wafer along said division lines, within the etching chamber, after performing said protective film forming step, said application time recording step, and said determining step; and
    a protective film removing step of supplying a cleaning water to said protective film to thereby remove said protective film after performing said etching step,
    wherein when it is determined in said determining step that said predetermined duration has not elapsed from the time recorded in said application time recording step, said etching step and said protective film removing step are performed,
    wherein the predetermined duration is based on the elapsed time at which the protective film starts to be deteriorated by the etching step.

2. The device wafer processing method according to claim 1, further comprising:
    a cleaning step of supplying a cleaning water to said protective film to thereby remove said protective film after performing said determining step and before performing said etching step,
    wherein when it is determined in said determining step that said predetermined duration has elapsed from the time recorded in said application time recording step, said protective film is once removed in said cleaning step and thereafter said protective film forming step, said application time recording step, and said determining step are performed again in this order.

3. A device wafer processing method for processing a device wafer having a front side formed with a plurality of crossing division lines for defining a plurality of separate regions where a plurality of devices are formed, said device wafer processing method comprising:
    a protective film forming step of applying a water-soluble protective film material to the front side of said device wafer and next exposing said division lines to form a protective film for protecting each device, wherein the water-soluble protective film material comprises a liquid resin;
    an application time recording step of recording the time at which said water-soluble protective film material is applied to said device wafer, wherein said application time recording step is performed after a predetermined thickness of the protective film has been applied on an entire surface of the front side of said device wafer during said protective film forming step;
    a determining step of determining whether or not a predetermined duration has elapsed from the time recorded in said application time recording step, wherein the predetermined duration is based upon the kind of water-soluble protective film material, wherein said determining step is performed when said device wafer passes by a mark reading section that reads a mark indicative of individual identifying information of said device wafer, and further wherein said determining step is performed before said device wafer enters an etching chamber;
    an etching step of dry-etching said device wafer along said division lines, within the etching chamber, after performing said protective film forming step, said application time recording step, and said determining step; and
    a protective film removing step of supplying a cleaning water to said protective film to thereby remove said protective film after performing said etching step,
    wherein when it is determined in said determining step that said predetermined duration has not elapsed from the time recorded in said application time recording step, said etching step and said protective film removing step are performed.

4. The device wafer processing method according to claim 3, further comprising:
    a cleaning step of supplying a cleaning water to said protective film to thereby remove said protective film after performing said determining step and before performing said etching step,
    wherein when it is determined in said determining step that said predetermined duration has elapsed from the time recorded in said application time recording step, said protective film is once removed in said cleaning step and thereafter said protective film forming step, said application time recording step, and said determining step are performed again in this order.

5. A device wafer processing method for processing a device wafer having a front side formed with a plurality of crossing division lines for defining a plurality of separate regions where a plurality of devices are formed, said device wafer processing method comprising:
    a protective film forming step of applying a water-soluble protective film material to the front side of said device wafer and next exposing said division lines to form a protective film for protecting each device, wherein the water-soluble protective film material comprises a liquid resin;
an application time recording step of recording the time at which said water-soluble protective film material is applied to said device wafer, wherein said application time recording step is performed after a predetermined thickness of the protective film has been applied on an entire surface of the front side of said device wafer during said protective film forming step;
a determining step of determining whether or not a predetermined duration has elapsed from the time recorded in said application time recording step, wherein the predetermined duration is based upon the thickness of the protective wherein said determining step is performed when said device wafer passes by a mark reading section that reads a mark indicative of individual identifying information of said device wafer, and further wherein said determining step is performed before said device wafer enters an etching chamber;
an etching step of dry-etching said device wafer along said division lines, within the etching chamber, after performing said protective film forming step, said application time recording step, and said determining step; and
a protective film removing step of supplying a cleaning water to said protective film to thereby remove said protective film after performing said etching step,
wherein when it is determined in said determining step that said predetermined duration has not elapsed from the time recorded in said application time recording step, said etching step and said protective film removing step are performed.

6. The device wafer processing method according to claim 5 further comprising:
a cleaning step of supplying a cleaning water to said protective film to thereby remove said protective film after performing said determining step and before performing said etching step,
wherein when it is determined in said determining step that said predetermined duration has elapsed from the time recorded in said application time recording step, said protective film is once removed in said cleaning step and thereafter said protective film forming step, said application time recording step, and said determining step are performed again in this order.

7. A device wafer processing method for processing a device wafer having a front side formed with a plurality of crossing division lines for defining a plurality of separate regions where a plurality of devices are formed, said device wafer processing method comprising:
a protective film forming step of applying a water-soluble protective film material to the front side of said device wafer and next exposing said division lines to form a protective film for protecting each device, wherein the water-soluble protective film material comprises a liquid resin;
an application time recording step of recording the time at which said water-soluble protective film material is applied to said device wafer, wherein said application time recording step is performed after a predetermined thickness of the protective film has been applied on an entire surface of the front side of said device wafer during said protective film forming step;
a determining step of determining whether or not a predetermined duration has elapsed from the time recorded in said application time recording step, wherein said determining step is performed when said device wafer passes by a mark reading section that reads a mark indicative of individual identifying information of said device wafer, and further wherein said determining step is performed before said device wafer enters an etching chamber, and
responsive to a determination during said determining step that said predetermined duration has elapsed from the time recorded in said application time recording step, performing:
a cleaning step of supplying a cleaning water to said protective film to thereby once remove said protective film after performing said determining step, and
thereafter performing said protective film forming step a second time, performing said application time recording step a second time, and performing said determining step a second time, in this order.

8. The device wafer processing method according to claim 7, responsive to a determination during said determining step, that has been performed the second time, that said predetermined duration has not elapsed from the time recorded in said application time recording step, performing:
an etching step of dry-etching said device wafer along said division lines, within the etching chamber, after performing said protective film forming step, said application time recording step, and said determining step; and
a protective film removing step of supplying a cleaning water to said protective film to thereby remove said protective film after performing said etching step.

9. The device wafer processing method according to claim 3, wherein the protective film is selected from the group consisting of polyvinyl pyrrolidone and polyvinyl alcohol.

10. The device wafer processing method according to claim 5, wherein the protective film is selected from the group consisting of polyvinyl pyrrolidone and polyvinyl alcohol.

11. The device wafer processing method according to claim 7, wherein the protective film is selected from the group consisting of polyvinyl pyrrolidone and polyvinyl alcohol.

12. The device wafer processing method according to claim 3, wherein the predetermined duration is also based upon the thickness of the protective film.

13. The device wafer processing method according to claim 7, wherein the predetermined duration is based on the elapsed time at which the protective film starts to be deteriorated by the etching step.

14. The device wafer processing method according to claim 10, wherein the predetermined duration is also based upon the kind of water-soluble protective film material.

15. The device wafer processing method according to claim 7, wherein the predetermined duration is based upon both the kind of water-soluble protective film material and the thickness of the protective film.

* * * * *